United States Patent [19]

Nagasawa

[11] Patent Number: 4,781,477

[45] Date of Patent: Nov. 1, 1988

[54] DOT MATRIX PRINT HEAD

[75] Inventor: Hideo Nagasawa, Oiso, Japan

[73] Assignee: NCR Corporation, Dayton, Ohio

[21] Appl. No.: 108,233

[22] Filed: Oct. 13, 1987

[30] Foreign Application Priority Data

Nov. 7, 1986 [JP] Japan ................................ 61-263869

[51] Int. Cl.$^4$ .......................... B41J 3/12; H01L 41/04

[52] U.S. Cl. ................................. 400/124; 101/93.02; 101/93.05; 400/167; 310/328

[58] Field of Search ........................ 400/124, 121, 167; 101/93.04, 93.05, 93.02; 310/328, 329, 345, 348

[56] References Cited

U.S. PATENT DOCUMENTS

| | | | |
|---|---|---|---|
| Re. 31,813 | 1/1985 | Fugate et al. | 400/124 X |
| 3,473,466 | 10/1969 | Thayer | 101/93 |
| 3,843,898 | 10/1974 | Maciag | 310/82 |
| 3,940,726 | 2/1976 | Gershnow | 400/124 |
| 4,014,425 | 3/1977 | Gijzen et al. | 400/124 |
| 4,157,873 | 6/1979 | Ito | 400/124 |
| 4,200,401 | 4/1980 | Roy et al. | 400/124 |
| 4,236,837 | 12/1980 | Seilly | 400/124 |
| 4,490,057 | 12/1984 | Reece | 400/124 |
| 4,632,580 | 12/1986 | Wirth et al. | 400/124 |

OTHER PUBLICATIONS

"Institute of Electronics and Communication Engineers of Japan Technical Report", vol. 84, No. 289, EMC 84–49, Feb. 15, 1985.

*Primary Examiner*—Paul T. Sewell
*Attorney, Agent, or Firm*—Wilbert Hawk, Jr.; Albert L. Sessler, Jr.; George J. Muckenthaler

[57] ABSTRACT

A piezoelectric crystal element is resiliently urged to a home position and drives a plunger member and a print wire in printing operation. Upon rebound movement, the crystal element contacts a step portion of the print head housing to inhibit oscillation of the crystal element more rapidly than oscillation of the plunger member.

18 Claims, 2 Drawing Sheets

DOT MATRIX PRINT HEAD

BACKGROUND OF THE INVENTION

In the field of printing, the most common type of printer has been the printer which impacts against record media that is caused to be moved past a printing line or line of printing. As is well-known, the impact printing operation depends upon the movement of impact members, such as print hammers or wires or the like, which are typically moved by means of an electromechanical system and which system enables precise control of the impact members.

In the field of dot matrix printers, it has been quite common to provide a print head which has included therein a plurality of print wire actuators or solenoids arranged or grouped in a manner to drive the respective print wires a very short, precise distance from a rest or non-printing position to an impact or printing position. The print wires are generally either secured to or engaged by the solenoid plunger or armature which is caused to be moved such precise distance when the solenoid coil is energized and wherein the plunger normally operates against the action of a return spring.

In the wire matrix printer, the print head structure may be a multiple-element type with the wire elements aligned in a vertical line and supported on a print head carriage which is caused to be moved or driven in a horizontal direction for printing in line manner, while the drive elements or transducers may be positioned in a circular configuration with the respective wires leading to the front tip of the print head.

Alternatively, the printer structure may include a plurality of equally-spaced, horizontally-aligned single-element print heads which are caused to be moved in back-and-forth manner to print successive lines of dots in making up the lines of characters. In this latter arrangement, the drive elements or transducers are individually supported along a line of printing. These single wire actuators or solenoids are generally tubular or cylindrically shaped and include a shell which encloses a coil, an armature and a resilient member arranged in manner and form wherein the actuator is operable to cause the print wire to be axially moved a small precise distance in dot matrix printing. The print wire is contained and guided at the front of the solenoid in axial direction during the printing operation. It is in the field of print wire actuators that the subject matter of the present invention is most closely associated and which provides for improved positioning and control of the print wire during printing operations.

While the conventional actuator of the type utilizing magnetic energy, such as the solenoid, is widely used, its low electro-mechanical conversion efficiency is a disadvantage when compared with a piezoelectric crystal element actuator utilizing the piezoelectric effect which permits a highly efficient electro-mechanical conversion.

Representative documentation in the field of dot matrix print head wire actuators includes U.S. Pat. No. 3,473,466, issued to L. C. Thayer on Oct. 21, 1969, which discloses an electrostrictive print hammer actuator, in the form of a bar-shaped piezoelectric crystal for driving a print hammer that is held in position by two upstanding flat springs in essentially free-flight manner against a type wheel.

U.S. Pat. No. 3,843,898, issued to E. T. Maciag on Oct. 22, 1974, discloses a piezoelectric mounting with variable damping wherein the piezoelectric element is freely suspended by contact springs and the mounting includes rigidly positioned damping means and movable damping means.

U.S. Pat. No. 3,940,726, issued to A. H. Gerschnow on Feb. 24, 1976, discloses a high speed solenoid having an armature initially driven against the biasing force of a weak spring. Just before impact, the armature is biased by a spring having a greater spring force to return the armature to the non-impact position.

U.S. Pat. No. 4,014,425, issued to W. A. H. Gijzen et al. on Mar. 29, 1977, discloses a recording element including a stylus and having an armature subject to action of a coiled spring that has two end sections with closely wound turns and an axial section with an inside diameter larger than the diameter of the stylus.

U.S. Pat. No. 4,157,873, issued to M. Ito on June 12, 1979, discloses a ferromagnetic core and a leaf spring biasing the core and deformed by a stopper. An annular washer is provided between the stopper and a shoulder of the housing and a coiled spring urges the washer against the shoulder.

U.S. Pat. No. 4,200,401, issued to K. L. Roy et al. on Apr. 29, 1980, discloses a print wire solenoid having an armature and a retraction spring anchored to a plastic body and positioned with respect to a datum surface. A rebound disc is positioned to locate the datum surface of the armature in the same plane as the datum surface of the stator assembly.

U.S. Pat. No. 4,236,837, issued to A. H. Seilly on Dec. 2, 1980, discloses an operating mechanism with a pre-loaded spring acting on the armature wherein the inertia only of the armature and the print wire causes impact of the wire on paper.

U.S. Pat. No. 4,490,057, issued to J. W. Reece on Dec. 25, 1984, discloses a solenoid having an enclosure member releasably secured to one end by a deformed spring member and an energy absorbing member adjacent the enclosure member. A plunger member is located adjacent and engaging the absorbing member during rebound movement to transmit forces to the enclosure and the spring member.

U.S. Pat. No. Re. 31,813, issued to P. E. Fugate et al. on Jan. 22, 1985, discloses a solenoid having a rebound and energy absorbing arrangement which uses a block of dead elastomeric material held in a partially compressed state by an impact plate.

And, U.S. Pat. No. 4,632,580, issued to R. L. Wirth et al. on Dec. 30, 1986, discloses a dampening mechanism which uses a single injection molded plastic piece with a plurality of plunger backstops arranged in a circle and spring hinged for impact against a rubber damper.

The principle of using a multi-layered type actuator is disclosed in the Institute of Electronics and Communication Engineers of Japan Technical Report, Vol. 84, No. 289, EMC 84-49, issued on Feb. 15, 1985.

SUMMARY OF THE INVENTION

The present invention relates generally to impact printing devices for dot matrix printing. More particularly, the invention relates to a print head wherein a print wire is propelled against a printing medium by an actuating unit. The actuating unit includes a multi-layered type piezoelectric ceramic element that is contained within an enclosure and drives a plunger and a print wire in the direction of a platen and against the bias or resilience of a return spring. The movement of the ceramic element is limited in such direction by contact of the element with a surface of the plunger guide and rebound movement is limited by contact with a surface of the guide for the element enclosure.

A transmission plate is secured to or integral with the ceramic element and is engageable with or in contact with the plunger. The plate strikes the surface of the plunger guide upon actuation of the ceramic element and the element enclosure strikes the opposed surface upon rebound of the ceramic element. A coiled rebound spring or a leaf spring may be used to bias the ceramic element in the predetermined home position and such spring is used as a damping means on the rebound strike of the ceramic element.

In accordance with the above discussion, a principal object of the present invention is to provide an improved dot matrix type wire printer.

Another object of the present invention is to provide a piezoelectric type actuating unit for driving a print wire in free-flight manner.

An additional object of the present invention is to provide an actuating unit that uses individual piezoelectric units and constructed such that the rebounding operation of a plunger and print wire is rapidly dampened so that the print wire can be driven at a higher speed.

A further object of the present invention is to provide an actuating unit which is small in size, light in weight and permits the higher speed operation at less cost.

Still another object of the present invention is to provide a dot matrix print head having a piezoelectric element that drives a plunger member and a print wire and includes a stop portion to inhibit oscillation of the element more rapidly than oscillation of the plunger member and the print wire upon return to the non-printing position.

Additional advantages and features of the present invention will become apparent and fully understood from a reading of the following description taken together with the annexed drawing.

DESCRIPTION OF THE PREFERRED EMBODIMENT

Figure 1:
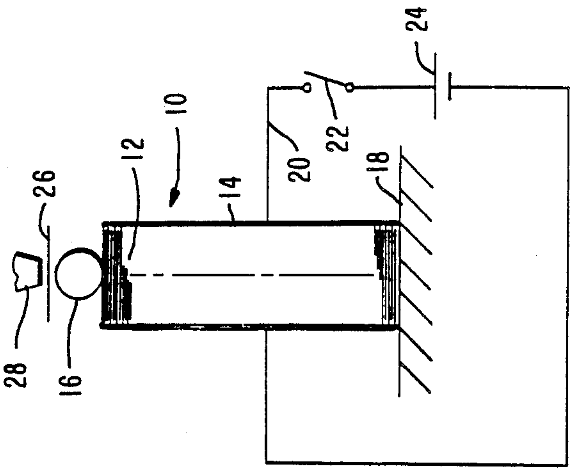
FIG. 1 is a diagrammatic representation of the principle using a multi-layered type piezoelectric element.

Prior to describing the structure of the present invention, FIG. 1 shows the principle of using a multi-layered type piezoelectric actuator 10 having a plurality of individual piezoelectric crystal elements 12 contained within an enclosure 14. An impact print member 16 in the form of a flight hammer is secured to the uppermost crystal element 12 and the assembly or enclosure 14 is secured to a frame or base 18. A voltage pulse is applied across the piezoelectric elements 12 through the wire 20 when a switch 22 is closed to connect a battery or like source 24. The piezoelectric actuator 10 is displaced upon application of the voltage pulse to move the print member 16 in an upward or outward direction a minute distance for impact against a print medium 26 and a platen 28.

It is seen from the principle illustrated in FIG. 1 that it is possible to use an actuating member having the multi-layered type piezoelectric elements for driving the print member 16 by appropriately designing the mass of such member and of any rebound means such as a spring (not shown) to return the print member 16 to its home position. It is also seen that since the print member 16 is driven in impact manner against the platen 28 at a high velocity in order to attain higher printing speeds, the print member will rebound from the platen after impact therewith.

Figure 3:
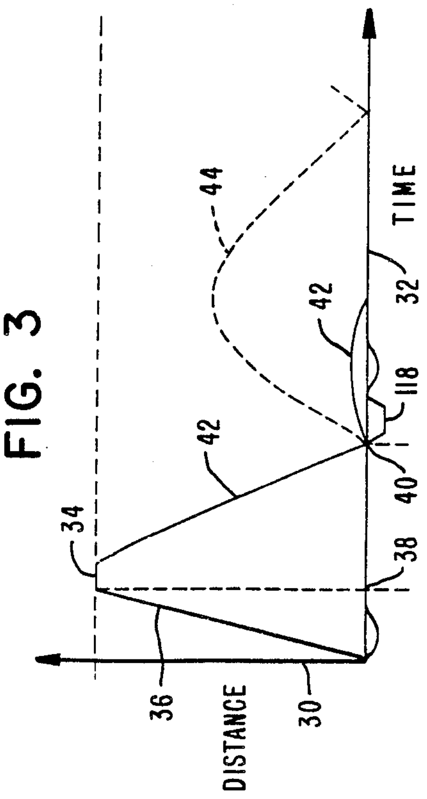
FIG. 3 is a diagram which plots the rebound characteristics of the driven element and the actuating unit.

The rebound action and characteristics of the print member 16 are shown in FIG. 3, wherein the vertical axis 30 designates a distance from the home position, the horizontal axis 32 designates a period of time, and the line 34 indicates the position of the platen 28. When the voltage pulse is applied across the piezoelectric elements 12, the actuator 10 is displaced to accelerate and to drive the print element 16 at a high velocity as shown by the solid line 36 against the platen 28. The print element 16 collides with or strikes the platen 28 at time 38 and then rebounds from the impact and collides with or strikes the actuator 10 at time 40 at a high velocity as shown by the solid line 42 and indicating the path of the print member 16. However, since the piezoelectric actuator 10 is fixed to the frame 18, the print member 16 tends to rebound off the actuator 10 after impact therewith as indicated by the dotted line 44.

Due to the minute displacement of the piezoelectric actuator 10, the rebounding action of the print member 16 off the actuator 10 causes a condition wherein the displacement of the actuator is not transmitted to the print member upon application of the voltage pulse across the piezoelectric elements 12 in the performing of a continuous printing operation and the print member 16 cannot be driven in repeated manner. Accordingly, this condition exists and the next printing operation cannot be performed until the rebounding action of the print member ceases, thereby resulting in a lower printing speed.

The present invention eliminates or at least minimizes the above-mentioned condition by an arrangement wherein a piezoelectric element actuator is movably supported with the use of an elastic or resilient member. The piezoelectric element actuator moves against the elastic member in accordance with the returning movement and operation of a driven body into collision or impact with the piezoelectric element actuator wherein the elastic member absorbs the shock action upon impact of the driven body with the actuator.

Figure 2:
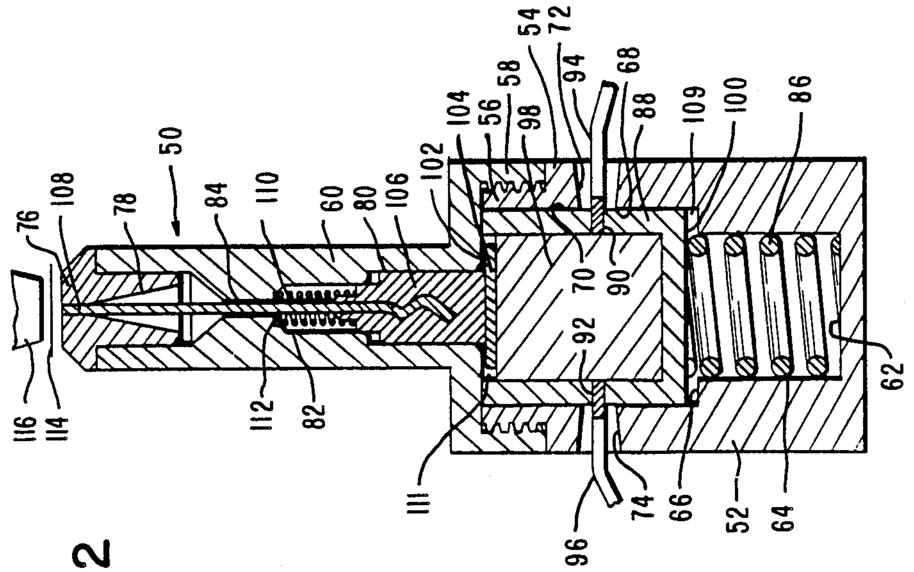
FIG. 2 is a sectional view for illustrating the actuating unit according to the embodiment of the present invention as applied to a wire dot printer.

FIG. 2 is a sectional view of a print head 50 incorporating the structure of the present invention and applied in an arrangement featuring a wire dot printer. A cylindrically-shaped shell or casing 52 provides a lower enclosure portion and an opposed shell or casing 54 of like diameter is disposed adjacent the casing 52 and provides an upper enclosure portion. The casing 54 includes a threaded portion 56 onto which is threaded a flanged portion 58 of an elongated cylindrical portion 60, the portion 60 being of smaller diameter than the diameter of the casings 52 and 54. The casing 52 includes a well having a floor 62 and a wall 64 extending upwardly to a shelf 66 bridging the wall 64 and a wall 68 of the casing 52. The wall 68 is aligned with a wall 70 of the casing 54. An aperture 72 is provided in the wall 64 on one side of the casing 52 and an aperture 74 is provided in the wall 64 on the other side of the casing. Of course, the structure may be designed to provide a single piece which includes the lower enclosure portion 52 and the upper enclosure portion 54 with an aperture in each side of the single piece.

A nose portion 76 is incorporated into and covers the top end of the cylindrical portion 60 and includes a cone-shaped aperture 78 extending the length thereof. The cylindrical portion 60 has an aperture 80 of a certain diameter, an adjoining aperture 82 of lesser diameter and a further aperture 84 of small diameter.

A coil spring 86 occupies the well in the lower enclosure portion 52 and has one end engaging the floor 62 and the other end of the coil engaging a U-shaped support portion 88 provided above the spring and contained by the walls 68 and 70. The U-shaped support portion 88 includes appropriate apertures 90 and 92 therein for wires 94 and 96 to pass therethrough and to connect with an actuating or driving member 98 which includes a plurality of piezoelectric elements in layered manner. The U-shaped member 88 has a bottom portion 100 engageable by the coil spring 86 and adaptable to engage the shelf 66 upon compression of the spring. The U-shaped support portion 88 is normally biased against a shelf 102 bridging the upper enclosure portion 58 and the cylindrical portion 60. A plate 104 is secured to the actuating member 98 and is in contact with and engages a plunger member 106 positioned within the aperture 80 and in which one end of a print wire 108 is contained in secured manner. A coil spring 110 is positioned within the aperture 82 with one end of the spring engageable with the plunger 106 and the other end of the spring engageable with a shelf 112 bridging the apertures 82 and 84. It is noted that a space 109 exists between the shelf 66 and the bottom portion 100 of the U-shaped member 88 and that a space 111 exists between the shelf 102 and the plate 104 above the piezoelectric element 90.

The U-shaped support member 88 supports the piezoelectric element 98 and is guided by the walls 68 and 70 of the enclosure portions 52 and 54. The coiled spring 86 performs as a rebound element and presses against the member 88 to maintain the member in a predetermined home position. The return spring 110 presses against the plunger 106 to maintain the plunger against the plate 104 and thereby place the piezo element 98 in a home or non-printing position. The cylindrical portion 60 includes the aperture 80 which serves as a guide for the plunger 106, the aperture 82 which serves as a guide for the spring 110, and the aperture 84 which serves as a guide for the print wire 108. The plate 104 which is secured to the piezo element 98, or which may be an integral part thereof, is made of wear resistant material to withstand the repeated collisions or impacts of the plunger 106 against the plate 104 upon return of the print wire from the printing to the non-printing position.

In the operation of the invention and using the structure of FIG. 2, when a voltage pulse is applied across the piezoelectric element 98 by means of the wires 94 and 96, the element is displaced upwardly to drive the plunger 106 and the print wire 108 by means and use of the plate 104. The print wire is caused to be impacted against the paper 114 and the platen 116 and then is returned to the home position by reaction to the impact and by the return spring 110 to contact the plate 104.

Since most of the energy generated upon the impact or collision of the plunger 106 with the plate 104 is absorbed by the piezoelectric element 98, the U-shaped support member 88, the coiled spring 86, and the kinetic energy of the downward movement of the member 88, the rebound of the plunger 106 is greatly reduced and rapidly contained as shown by the solid line 42 in FIG. 3. As long as the support member 88 is oscillating in up and down movement, regardless of the rapid cessation of the rebound of the plunger 006, a stable operation cannot be effected or realized. Accordingly, it is desirable that the oscillation of the support member 88 be diminished and ceased more rapidly than the oscillation of the plunger 106. In FIG. 2, the shelf 66 is designed and provided to limit the gap or space 109 between the bottom portion 100 of the member 88 and the shelf 66 through which the support member 88 can be moved.

The action and effect of the shelf 66 is described with reference to the solid line 118 in FIG. 3 which is indicative of the position of the U-shaped member 88 in FIG. 2. When the plunger 106 collides with or impacts the piezoelectric element 98 at the time 40, the member 88 is moved downward by the collision or impact energy. The member 88 moves into and through the space or gap 109, then contacts the shelf 66 which absorbs a portion of the kinetic energy, and then is returned to the home position by the reaction of the collision and by the coiled spring 86. In this manner the amplitude of the support member 88 is rapidly diminished as shown by the solid line extending beyond the time 40 in FIG. 3. The predetermined gap or space 109 between the shelf 66 and the bottom portion 100 of the support member 88 is designed and determined by the mass of the driven elements including the plunger 106 and the print wire 108, the mass of the support member 88 including the piezoelectric element 98, and the elastic modulus of the return spring 110 and of the rebound spring 86. While the shelf 66 is provided on the lower enclosure member 52 to eliminate oscillation of the driven elements, the structure could be designed such that the material and the mass of the plunger 106 and of the print wire 108, the material of the plate 104 and of the piezoelectric element 98, the mass of the support member 88, and the elastic modulus of the rebound spring 86 are well-balanced so as to substantially reduce any oscillation of the parts.

Figure 4:
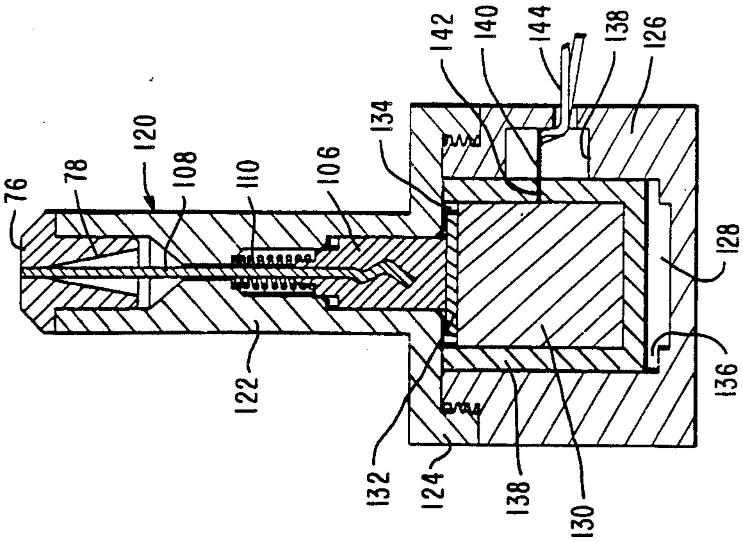
FIG. 4 is a sectional view illustrating a modification of the structure of the present invention.

FIG. 4 shows a modification of the structure of the present invention wherein a print head 120 includes many of the same elements of the structure of FIG. 2. Such elements include the nose portion 76, the aperture 78, the plunger 106 and the print wire 108. The print head 120 has an upper enclosure or casing 122 that is very similar to the casing 54 in FIG. 2 except that the lower flange portion 124 is shown as being larger in diameter and having fewer threads than the flange portion 58 in FIG. 2. A lower enclosure or casing 126 is threaded into the upper casing 122 and includes a well 128 for a piezoelectric element 130. A plate 132 for fitting with the element 130 is secured thereto with the element 130 being supported in a manner providing a space 134 between the plate 132 and the flange 124 of the casing 122. A space 136 is also provided between a piezo element support member 138 and the bottom of the well 128. The lower casing 126 defines a cutout portion 138 for receiving a leaf spring 140 that is used for supporting the member 138 and for providing rebound means for such member. The member 138 includes a slot or like opening 142 for receiving the spring 140. The wiring, as at 144, is connected to the leaf spring 140 which is used as a conductor to connect with the piezo element 130.

It should be noted that the plate 104 in FIG. 2 and the plate 132 in FIG. 4 are used in a manner wherein such plates are acting as transmitting plates during the printing operation and are acting as receiving plates during the non-printing or rebound operation. The plates 104 and 132 are provided with smooth surfaces in order to transmit and to receive the precise displacement of the piezo elements 98 and 130, respectively.

Figure 5:
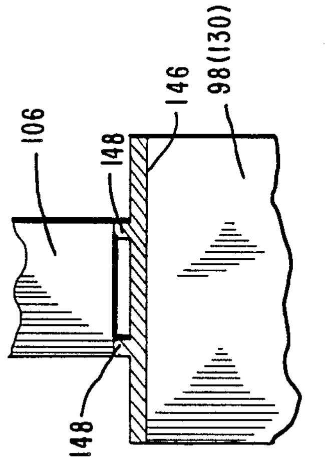
FIG. 5 is a diagrammatic view showing a different configuration of the transmission plate.

While the plates 104 and 132 may be made with entirely smooth surfaces, other configurations may be designed which provide a projecting portion on one side of the plate. FIG. 5 illustrates a plate 146 which may be screwed to either of the piezo elements 98 or 130 and which is in contact with the plunger 106. The plate 146 includes a peripheral projection 148 which contacts the plunger 106. Any configuration of the plate 146 which permits the accurate transmission of the precise and fine displacement of the piezo element may be used to provide the connection or coupling between the piezo element and the plunger 106. An advantage of the plate 146 with a projection therein such as the projection 148 is that the accurate transmission of the precise and fine displacement of the piezo element can be ensured even though the projection may be slightly worn or warped. The threaded connections of the parts 52 and 54 in FIG. 2 and of the parts 124 and 126 in FIG. 4 enable adjustment and control of slight wearing or warping of the plates or the projections, in addition to controlling the gap or space 111 or 134 above the plates.

Another feature of the present invention enables using the voltage pulse generated in association with the collision or rebound impact of the plunger 106 with the piezo element (98 or 130), so that the time required until the plunger 106 returns to the home position and collides or impacts with the piezo element after the application of the driving voltage pulse can be measured. The results of the time measurements can be used to calculate the speed at which the print wire impacts the paper or other print medium. Accordingly, it is possible to adjust the impact intensity or to adjust the print density in accordance with the type of print medium that is used such that the driving voltage pulse is varied based on the speed thus calculated so as to control the speed of the plunger 106 and the print wire 108.

It is thus seen that herein shown and described is a wire printer for printing characters in dot matrix manner wherein the print wire is driven by a multi-layered piezoelectric element. The driving or actuating mechanism is movably supported by a resilient member in order to absorb the kinetic energy that is generated upon the return operation of the driven parts. The rebound motion is rapidly dissipated and the print wire can be driven in stable manner at higher printing speeds. The printing mechanism of the present invention enables the accomplishment of the objects and advantages mentioned above, and while a preferred embodiment and a modification of the invention have been disclosed herein, other variations thereof may occur to those skilled in the art. It is contemplated that all such variations not departing from the spirit and scope of the invention hereof are to be construed in accordance with the following claims.

I claim:

1. A dot matrix print head comprising a housing, an actuating means within the housing, means supporting the actuating means, a plunger element operably associated with the actuating means and movable to and from a printing position, a print element secured to said plunger element and movable therewith, a platen opposite said print element, first resilient means for returning the plunger element and the print element from the printing position, second resilient means for urging the supporting means and the actuating means to a home position, and means for pulsing the actuating means for displacement thereof to move the plunger element against the first resilient means and to move the print element into impact with said platen, the impact causing said plunger element and said print element to rebound against said actuating means, said housing having shoulder means engageable by said actuating means upon rebound motion thereof to inhibit oscillation of the actuating means more rapidly than oscillation of the plunger element.

2. The print head of claim 1 wherein the actuating means comprises a piezoelectric element.

3. The print head of claim 1 wherein said first resilient means comprises a coiled spring.

4. The print head of claim 1 wherein said second resilient means comprises a coiled spring.

5. The print head of claim 1 wherein the supporting means comprises a U-shaped member for containing the actuating means therein.

6. The print head of claim 2 including a plate member secured to said piezoelectric element and engageable with said plunger element.

7. The print head of claim 2 wherein the piezoelectric element is a multi-layered element.

8. The print head of claim 6 wherein said plate member includes a projection engageable with said plunger element.

9. The print head of claim 6 wherein said plate member includes a peripheral projection engageable with said plunger element.

10. The print head of claim 1 wherein said second resilient means comprises a leaf spring.

11. Printing apparatus for dot matrix printing comprising a platen, a housing having a first portion and a second portion, an actuating member contained with the first portion, means supporting the actuating member, a plunger member operably associated with the actuating member and movable to and from a first position, a print element secured to said plunger member and movable therewith in said second portion, a first resilient member engageable with the plunger member for returning thereof from the first position, a second resilient member for urging the supporting means and the actuating member to a home position, and means for pulsing the actuating member for displacing thereof to move the print element into impact with said platen, the impact causing said plunger member to rebound against said actuating member, said first portion defining a shoulder engageable by said actuating member upon rebound motion thereof to inhibit oscillation of the actuating member more rapidly than oscillation of the plunger member.

12. The printing apparatus of claim 11 wherein the actuating member comprises a piezoelectric crystal element.

13. The printing apparatus of claim 11 wherein the first resilient member comprises a coiled spring.

14. The printing apparatus of claim 11 wherein the second resilient member comprises a coiled spring.

15. The printing apparatus of claim 11 wherein the supporting means comprises a U-shaped member contained within the first portion.

16. The printing apparatus of claim 12 including a plate member secured to said piezoelectric crystal element.

17. The printing apparatus of 16 wherein said plate member includes a peripheral projection engageable with said plunger member.

18. The printing apparatus of claim 11 wherein said second resilient member comprises a leaf spring.

* * * * *